US009323161B2

(12) United States Patent
Granik

(10) Patent No.: US 9,323,161 B2
(45) Date of Patent: *Apr. 26, 2016

(54) SOURCE OPTIMIZATION BY ASSIGNING PIXEL INTENSITIES FOR DIFFRACTIVE OPTICAL ELEMENT USING MATHEMATICAL RELATIONSHIP

(75) Inventor: Yuri Granik, Palo Alto, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 910 days.

This patent is subject to a terminal disclaimer.

(21) Appl. No.: 12/606,098

(22) Filed: Oct. 26, 2009

(65) Prior Publication Data

US 2010/0039633 A1      Feb. 18, 2010

Related U.S. Application Data

(63) Continuation of application No. 11/824,558, filed on Jun. 28, 2007, now Pat. No. 7,623,220, which is a continuation of application No. 11/041,459, filed on Jan. 21, 2005, now Pat. No. 7,245,354.

(60) Provisional application No. 60/541,335, filed on Feb. 3, 2004.

(51) Int. Cl.
*G03F 7/20* (2006.01)

(52) U.S. Cl.
CPC ............ *G03F 7/70441* (2013.01); *G03F 7/705* (2013.01); *G03F 7/70108* (2013.01)

(58) Field of Classification Search
CPC .................................................. G03F 7/70158
USPC ......................................... 355/69, 71, 67, 53
See application file for complete search history.

(56) References Cited

U.S. PATENT DOCUMENTS

| 4,532,650 A | 7/1985 | Wihl et al. |
| 5,396,584 A | 3/1995 | Lee et al. |

(Continued)

FOREIGN PATENT DOCUMENTS

| EP | 1 357 426 A2 | 10/2003 |
| JP | 06-275482 | 9/1994 |

(Continued)

OTHER PUBLICATIONS

International Search Report, International Application No. PCT/US2005/002091, International Filing Date Jan. 21, 2005.

(Continued)

*Primary Examiner* — Chia-How Michael Liu
(74) *Attorney, Agent, or Firm* — Klarquist Sparkman, LLP

(57) ABSTRACT

A system and method for optimizing an illumination source to print a desired pattern of features dividing a light source into pixels and determining an optimum intensity for each pixel such that when the pixels are simultaneously illuminated, the error in a printed pattern of features is minimized. In one embodiment, a method includes selecting a pattern of layout features by determining one or more periodic patterns of features that occurs in the layout database, defining a mathematical relationship between pixel intensities produced by a diffractive optical element and the selected pattern of features, where the mathematical relationship includes a heavier weighting for the periodic patterns of features, and assigning pixel intensities for the diffractive optical element using the mathematical relationship, where the pixel intensities are calculated to print the periodic features with greater image fidelity in proportion to the heavier weighting.

13 Claims, 14 Drawing Sheets

(56) References Cited

U.S. PATENT DOCUMENTS

| | | | |
|---|---|---|---|
| 5,680,588 | A | 10/1997 | Gortych et al. |
| 6,263,299 | B1 | 7/2001 | Aleshin et al. |
| 6,268,908 | B1 | 7/2001 | Bula et al. |
| 6,518,974 | B2 | 2/2003 | Taylor et al. |
| 6,563,566 | B2 | 5/2003 | Rosenbluth et al. |
| 6,792,159 | B1 | 9/2004 | Aufrichtig et al. |
| 6,911,286 | B2 | 6/2005 | Kang et al. |
| 6,928,634 | B2 | 8/2005 | Granik et al. |
| 7,107,573 | B2 | 9/2006 | Yamazoe et al. |
| 7,160,649 | B2 | 1/2007 | Lizotte |
| 7,245,354 | B2 | 7/2007 | Granik |
| 7,266,803 | B2 | 9/2007 | Chou et al. |
| 7,623,220 | B2 | 11/2009 | Granik |
| 2002/0140920 | A1 | 10/2002 | Rosenbluth et al. |
| 2002/0152452 | A1 | 10/2002 | Socha |
| 2003/0236653 | A1 | 12/2003 | Zinn |
| 2004/0013950 | A1 | 1/2004 | Kang et al. |
| 2005/0226000 | A1 | 10/2005 | Bader et al. |
| 2006/0269875 | A1 | 11/2006 | Granik |
| 2007/0006113 | A1 | 1/2007 | Hu et al. |
| 2007/0198963 | A1 | 8/2007 | Granik et al. |
| 2008/0174756 | A1 | 7/2008 | Granik et al. |

FOREIGN PATENT DOCUMENTS

| | | |
|---|---|---|
| JP | 08-335552 | 12/1996 |
| JP | 09-236906 | 9/1997 |
| JP | 2002-261004 | 9/2002 |
| JP | 2002-334836 | 11/2002 |
| JP | 2003-318100 | 11/2003 |
| JP | 2004-012932 | 1/2004 |
| JP | 2004-031962 | 1/2004 |
| WO | WO 99/45558 | 9/1999 |
| WO | WO 2004/006021 | 1/2004 |
| WO | WO 2005/078528 | 8/2005 |

OTHER PUBLICATIONS

Written Opinion of the International Searching Authority, International Application No. PCT/US2005/002091, International Filing Date Jan. 21, 2005.

Cobb et al., "OPC Methods to Improve Image Slope and Process Window," *Proceedings of SPIE, Design and Process Integration for Microelectronic Manufacturing*, vol. 5042, pp. 116-125 (Feb. 27, 2003).

Cobb et al., "Fast, Low-Complexity Mask Design," *Proceedings of SPIE: Symposium on Optical/Laser Microlithography VIII*, vol. 2440, pp. 313-327 (Feb. 22-24, 1995).

Granik, "Source Optimization for Image Fidelity and Throughput," *Journal of Microlithography, Microfabrication, and Microsystems*, vol. 3, pp. 509-522 (Oct. 2004).

Granik, "Illuminator Optimization Methods in Microlithography," *Proceedings of SPIE: Novel Optical Systems Design and Optimization VII*, vol. 5524, pp. 217-229 (Aug. 2, 2004).

Himel et al., "Design and Fabrication of Customized Illumination Patterns for low k1 Lithography: a Diffractive Approach," *Proceedings of SPIE: Optical Microlithography XIV*, vol. 4346, pp. 1436-1442 (Feb. 27, 2001).

Hwang et al., "Layer-Specific Illumination for Low-$k_1$ Periodic and Semiperiodic DRAM Cell Patterns: Design Procedure and Application," *Proceedings of SPIE: Optical Microlithography XVII*, vol. 5377, pp. 497-952 (Feb. 24, 2004).

Murai von Bünau, "Depth of Focus Enhancement in Optical Lithography," Ph.D. Dissertation, Stanford University, 164 pp. (Jan. 1995).

Van Den Broeke et al., "Contact and Via Hole Mask Design Optimization for 65nm Technology Note," *Proceedings of SPIE: 24th Annual BACUS Symposium on Photomask Technology*, vol. 5567, pp. 680-690 (Sep. 14, 2004).

Official Action from the Japanese Patent Office and English-language translation of same for Japan App. No. 2006-552144 (corresponding to W/O 2005/078528) dated Nov. 4, 2010, 10 pages.

Official Action from the Japanese Patent Office and English-language translation of same for Japan App. No. 2006-552144 (corresponding to WO 2005/078528) dated Feb. 18, 2010, 8 pages.

Official Action from the Japanese Patent Office for Japan Patent App. No. 2011-103314 (with English-language translation), dated Mar. 7, 2014, 10 pages.

Official Action from the Japanese Patent Office for Japan Patent App. No. 2014-155831 (with English-language translation), dated Jun. 22, 2015, 10 pages.

$$T \cdot R_i = Image$$

Fig.2A.

$$\begin{bmatrix} T = \\ \text{CONTRIBUTION} \\ \text{OF EACH LIGHT} \\ \text{SOURCE POINT} \\ \text{TO A POINT} \\ \text{ON WAFER} \end{bmatrix} \begin{bmatrix} R = \\ \text{SOURCE} \\ \text{INTENSITY} \\ \text{POINTS} \end{bmatrix} = \begin{bmatrix} I = \\ \text{DESIRED} \\ \text{IMAGE} \end{bmatrix}$$

Fig.2B.

SOURCE OPTIMIZATION BY ASSIGNING PIXEL INTENSITIES FOR DIFFRACTIVE OPTICAL ELEMENT USING MATHEMATICAL RELATIONSHIP

CROSS-REFERENCE TO RELATED APPLICATIONS

The present application is a continuation of U.S. patent application Ser. No. 11/824,558, filed Jun. 28, 2007 now U.S. Pat. No. 7,623,220, which is a continuation of U.S. patent application Ser. No. 11/041,459, filed Jan. 21, 2005, now U.S. Pat. No. 7,245,354, which claims the benefit of U.S. Provisional Patent Application No. 60/541,335, filed Feb. 3, 2004. U.S. patent application Ser. No. 11/824,558, application Ser. No. 11/041,459, and Application No. 60/541,335 are all hereby incorporated herein by reference.

FIELD OF THE INVENTION

The present invention relates generally to photolithographic processing techniques and in particular to the optimization of an illumination source for printing a set of features on a wafer.

BACKGROUND OF THE INVENTION

In conventional semiconductor processing, circuit elements are created on a wafer by exposing photosensitive materials on the wafer with a pattern of transparent and opaque features on a mask or reticle. The selectively exposed areas of the photosensitive materials can then be further processed to create the circuit elements. As the size of the circuit elements to be created on the wafer becomes similar to, or smaller than, the wavelength of light or radiation that illuminates the mask, optical distortions can occur that adversely affect the performance of the circuit. To improve the resolution of the photolithographic process, many circuit design programs utilize one or more resolution enhancement techniques (RETs) that attempt to compensate for the expected optical distortion such that the mask patterns will be printed correctly on the wafer.

It is well known that one factor in determining how well a pattern of features on a mask will print is the pattern of light or radiation that illuminates the mask. Certain types or orientations of features on a mask will print with better fidelity when exposed with a particular illumination pattern. For example, off-axis illumination has been used in microlithography for projection printing since the late 1980s because it increases resolution and depth of focus for certain layout patterns and design styles. Due to the demand to resolve smaller and smaller images, the deployment of a variety of off-axis illumination source shapes was developed: first annular, then quadrapole, and lately dipole. These illumination source shapes can be formed by hard stop apertures or by diffractive optical elements (DOE). The latter is advantageous because it preserves light energy on the way from a laser source to the mask (object) resulting in less throughput loss. In addition, DOEs can form very complex source shapes, with a smooth distribution of light across the aperture. This enables source tuning to print certain layout features with high resolution. Although lithographic exposure equipment is compatible with the use of more complex illumination shapes, there has been no technique to reliably determine a practical optimum illumination pattern for a given layout pattern, and in particular for that layout pattern once RETs have been applied. Therefore, there is a need for a method of determining what illumination pattern should be used for a particular pattern of features to be printed on a wafer.

SUMMARY OF THE INVENTION

To address the problems discussed above and others, the present invention is a method and apparatus for determining an optimum illumination pattern for use in exposing a mask or reticle having a pattern of features thereon. In one embodiment, a design layout or portion thereof is analyzed and a mathematical relationship such as one or more matrix equations are developed that relate how the features of the layout design will be printed from a light source having a number of pixels with different intensities. The matrix equations are then solved with one or more matrix constraints to determine the intensity of the pixels in the light source that will produce the best possible imaging of the features on a wafer.

In another embodiment of the invention, the layout pattern used to determine the optimum illumination pattern has had optical and process correction (OPC) or some other RET applied. The OPC corrected layout is used to determine the illumination pattern that can in turn be used to refine the OPC corrections in an iterative process.

BRIEF DESCRIPTION OF THE DRAWINGS

FIGS. 2A and 2B illustrate a matrix equation used to determine an optimized illumination source in accordance with one embodiment of the present invention;

DETAILED DESCRIPTION OF THE PREFERRED EMBODIMENTS

Before describing the illumination source optimizing techniques of the present invention, it is useful to provide an overview of previously tried illumination optimization techniques. The previous lack of rigorous formulations motivates discussion of the optimization objectives and constraints and the importance of using weighted and so-called Sobolev norms. As will be explained in detail below, the present invention states the main optimization problem as a set of the optimization objectives in a form of functional norm integrals to maximize image fidelity, system throughput, and source smoothness. These are reduced to a non-negative least square (NNLS) problem, which is solved by standard numerical methods. Examples of the present invention are then provided for important practical cases including alternating phase-shifting applied to regular and semi-regular pattern of contact holes, two types of SRAM cells with design rules from 100 nm to 160 nm, and complex semi-dense contact layer pattern. Finally, the present invention can be used with constraint optimization to smooth strong off-axis quadrapole illuminations in order to achieve better image fidelity for some selected layout patterns.

Methods for illuminator optimization can be classified by how the source is represented and how the objective function is defined. Table 1 below lists these common applications for source optimization along with their principal researchers, including parameterized, archels, and binary contours based optimization, and gray-level pixel-based optimization used in the present invention. The optimization objectives are listed in the first column and include spectral fidelity, image fidelity, depth of focus, modulation, exposure latitude, and throughput.

TABLE 1

OBJECTIVE FUNCTION AND SOURCE REPRESENTATIONS

| | Source | | | |
|---|---|---|---|---|
| Objective | Parametized | Archel | Contour | Pixel-based |
| Spectral Fidelity | Fehrs<br>Mack<br>Burkhardt | | | |
| Image Fidelity | Vallishayee | | | Present invention |
| Depth of focus | Ogawa<br>Smith<br>Brist<br>Inoue | Rosenbluth<br>Hsia<br>Vallishayee | Barouch** | Present invention** |
| Modulation | Fehrs<br>Inoue* | Burkhardt | | |
| Exposure Latitude (Image slope or NILS) | Mack<br>Smith<br>Brist | Rosenbluth | Barouch | |
| Throughput | Hsia | | | Present invention |

Figure 1:
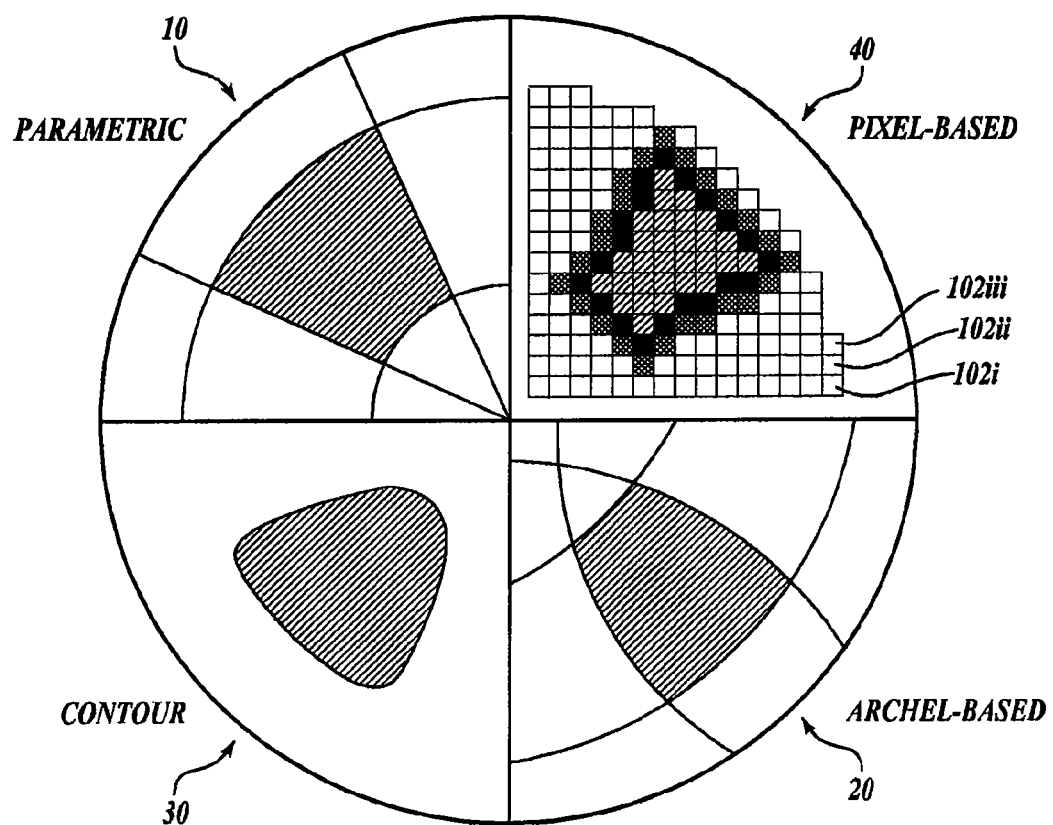
FIG. 1 illustrates a number of optimized illumination sources including a pixilated source in accordance with the present invention.

*DOF optimized by averaging through defocus
**DOF optimized by off-focus optimization The parameterized representation is used in source optimizations of the Brist and Bailey, Vallishayee, Orszag, and Barouch papers, and others from the second column in the Table 1. FIG. 1 illustrates a parameterized approach 10 whereby source geometries are composed of circles, rectangles, and other primary shapes. Parameters of these elementary shapes are subjected to an optimization procedure. One advantage of this approach is a limited number of optimization parameters. For example, for annular illumination only two parameters (sigma-in and sigma-out) are subjected to optimization. The drawback of source parameterization is that its optimization is considered as a generic non-linear problem. This does not take advantage of the natural structure and properties of optical equations. In addition to this, the solution domain is not full, e.g., is limited to those shapes that can be parameterized and usually does not capture complex and/or gray-level configurations. The parameterization can also be carried out by imposing angular or radial constraints on the source shape, or by considering only radial dependency as in the Inoue paper.

Diffraction pattern analyses and arch-based representations are used in the Burkhardt paper. In the pupil diagram, important mask spectrum components are isolated, then unit circles are drawn around them. These circles break the source into arch-bounded areas, which are referred to as archels by analogy with the word pixels. The optimum source is composed of these archels 20 as shown in FIG. 1. In the Hsia paper, areas where only two circles intersect are used based on the 2-beam design principles for best focus latitude. In the Rosenbluth paper, the source is broken into archels. Each archel is assumed to have a uniform brightness. The brightness of the archels is found from the optimization procedure. An advantage of this method a natural division of the source into regions that direct light into certain components of the pupil spectrum. The disadvantage is the assumption that within each archel the light distribution is uniform. This is not necessarily true when non-trivial pupil transmissions (with defocus for example) are considered.

A contour-based representation 30 as shown in FIG. 1 is described in the Barouch paper. Everything inside the contour is assumed to have brightness 1 and outside a brightness of 0. This is a more compact representation than the pixel-based one. The disadvantage comes from the usual problems of moving contours, e.g., contour self-intersections in the form of swallow tails. Even a more important limitation is that only binary light sources are considered, like for the hard-stop apertures, and gray-level light distributions are not addressed.

To improve upon the prior attempts at source optimization, the present invention divides a source into a number of pixels and determines the optimum brightness for each pixel for a given layout in a manner that will be physically practical to achieve and can be used in a real world lithographic system. A pixel-based representation 40 as shown in FIG. 1 can handle continuously-distributed light sources, like DOE produces. It is the most flexible representation. However, the dimensionality of the problem is the largest among all mentioned representations. An optimization solution for the fine-grained source may have more than 10,000 pixels. However, with currently available computers a solution can be obtained.

Before discussing the particular mathematical techniques used to optimize a light source in accordance with one embodiment of the present invention, it is useful to provide an overview of the techniques employed. FIGS. 2A and 2B illustrate the form of a linear equation solved by an embodiment of the present invention in order to determine the optimal distribution of light from an illumination source in order to produce a desired image in accordance with the present invention. As shown in FIG. 1, the area of a light source is divided into a number of pixels 102*i*, 102*ii*, 102*iii*, etc. The present invention therefore serves to determine the proper intensity of the light source at each pixel in order to optimally print a mask pattern on a wafer. As will be discussed in further detail below, the illumination pattern is optimized to print the desired mask pattern with optimal fidelity and to maximize throughput of the system such that solutions with increased brightness are favored over darker solutions. In addition, solutions that are continuous and smooth are favored over solutions that are discontinuous or solutions with bright spots that may damage the imaging optics of a photolithographic printing system. In one embodiment, a continuous solution means that no pixels having a non-zero intensity are surrounded by pixels having zero intensity, or stated another way, pixels having non-zero intensities are located in one or more groups of adjacent non-zero pixels. In one embodiment, smoothness is defined such that the intensities of adjacent pixels do not vary by more than some predefined amount.

The solutions for the distribution of light from the illumination source are generally symmetric around a central axis of the illumination source. However, a solution may not be symmetric for some feature patterns.

As shown in FIG. 2A, the basic linear equation relates the product of a transfer matrix T and a source matrix R to a matrix I defining a desired image. The matrix T defines the contribution of each light source pixel to an image point on a wafer. The matrix R defines the intensity of the light source at each pixel. The matrix I defines the desired pattern of objects to be created on a wafer. Typically, each entry in the matrix I is either a 0 or a 1 defining areas of exposure or non-exposure on the wafer. Solving the matrix equation shown in FIG. 2A yields the entries of the source matrix R that specify the desired intensity at each of the pixilated points in the light source. From the solution for the source matrix R, a diffractive optical element (DOE) can be fashioned for use with a photolithographic printing system that will simultaneously produce a pixilated light source whereby the pixels distribute the light in the desired manner. Such diffractive optical elements can be made by Digital Optics Corporation of Charlotte, N.C., the details of which are considered known to those of ordinary skill in the art. Alternatively, a dedicated light source can be produced that will distribute illumination light in the designed pattern using conventional optical techniques, such as lenses and stops, etc.

Figure 3:
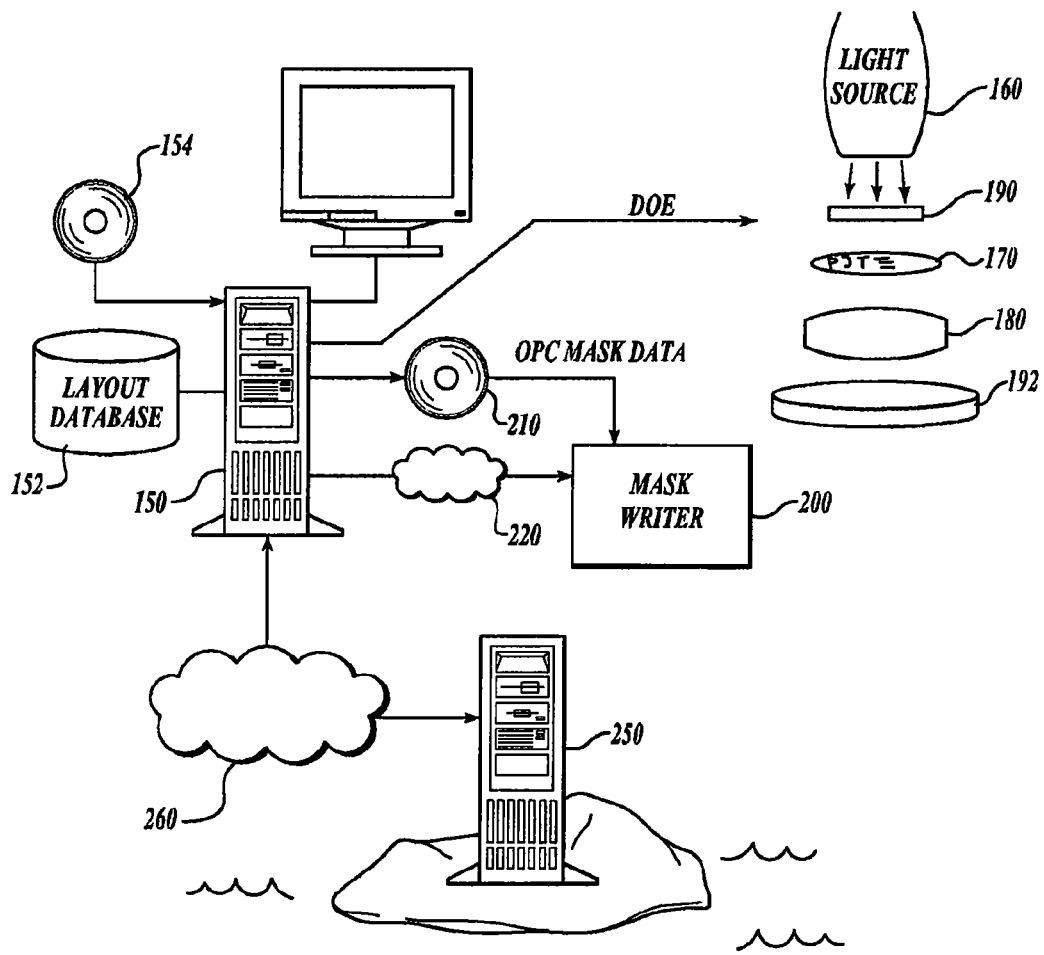
FIG. 3 illustrates one embodiment of a computer system that may be used for implementing the present invention.

FIG. 3 illustrates a representative computer-based system for implementing the present invention. The computer-based system includes a centralized or distributed computer 150 (i.e., a computer with multiple microprocessors, or a network of linked computers) that reads at least a portion of a layout design to be formed on an integrated circuit or other device. Typically, the layout design is stored in a layout database 152. The computer 150 reads a computer program stored on a computer-readable medium 154, such as a CD-ROM, DVD, magnetic tape, hard disc drive, flash card, etc., or may be received via a wired or wireless communication link. The computer system 150 executes the instructions of the computer program in order to optimize the illumination pattern from a light source 160 that will be used with a photolithographic mask or reticle 170 to produce the desired features on a semiconductor wafer 192 using a suitable imaging system. Typically, such an imaging system will be a 4× reduction system, i.e., the dimensions on the mask will be 4 times larger than the corresponding image features on the wafer. However, other reduction factors, such as 1×, 5×, 6×, or even 10× imaging systems can be used with this invention as well. In one embodiment of the invention, the pattern of illumination is controlled by a diffractive optical element 190 positioned between the light source 160 and the mask 170. However, the present invention could also be used to design the light source 160 itself such as by adding hard stop elements to the light source or other optical elements required to produce the distribution of light determined by the computer system 150.

The computer system 150 may also perform one or more resolution enhancement techniques on the layout design such as optimal proximity correction (OPC) in order to produce an OPC corrected mask data that is provided to a mask writer 200. The OPC corrected mask data may be provided to the mask writer 200 on a computer-readable medium 210 such as a CD-ROM, DVD, hard disc, flash card, or the like. Alternatively, the OPC corrected mask data may be provided to the mask writer 200 via a wireless or wired communication link 220. In one embodiment of the invention, the computer system 150 that determines the distribution of illumination light resides within the United States. However, it is possible that the computer system 150 may communicate with one or more remotely located computers 250 that may be outside the United States. Data is transmitted to the one or more remote computer systems 250 via a wired or wireless communication link, such as the Internet 260. The remote computer system 250 performs the illumination source optimization method of the present invention and the results of the optimization method are used to produce the light source 160 or a diffractive optical element 190 used to print the mask pattern 170 on one or more wafers 180.

Figure 4:
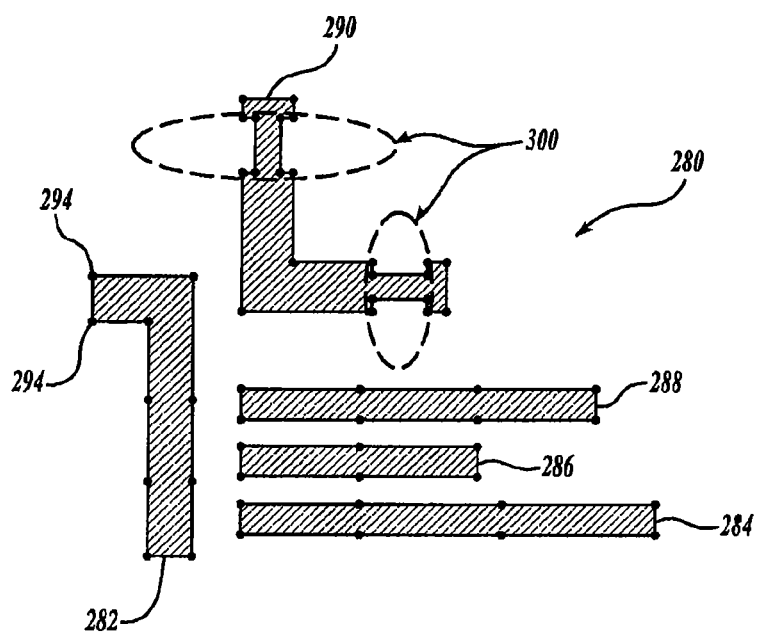
FIG. 4 illustrates how areas of a feature can be weighted when optimizing the illumination source and corrected during OPC.

As will be discussed in further detail below, the present invention optimizes an illumination source by reading all or a portion of a desired layout pattern such as that shown in FIG. 4. Here, a layout pattern 280 includes a number of polygons 282, 284, 286, 288, 290, that define objects to be created on a semiconductor wafer or may define objects to assist in the printing of objects such as subresolution features, phase shifting regions, etc. In conventional processing, each of the polygons 282-290 is fragmented with a number of fragmentation end points 294 that divide the perimeter of each polygon into a number of edge segments. As will be appreciated by those of ordinary skill in the art, resolution enhancement technologies, such as OPC, operate to increase the ability of the layout pattern to print correctly by, for example, moving each edge segment inwards or outwards, adding sub-resolution features or phase shifters, serifs, etc., such that the pattern of polygons will be correctly printed on a wafer. As will be explained in further detail below, in one embodiment of the invention, the distribution of light from the light source is optimized such that each polygon in the desired layout that is supposed to print on the wafer will print equally as well. However, in other embodiments of the invention, it may be desirable to emphasize certain portions of the layout that are critical for a circuit operation. For example, FIG. 4 shows two areas 300 that may correspond to transistor gate regions whereby accurate formation of the gate areas on a semiconductor wafer is critical to circuit operation. In some embodiments, the areas 300 are weighted in the matrix calculation described above such that the distribution of light from the light source is optimized to accurately print the weighted regions with greater fidelity at the expense of the fidelity in the other regions.

Figure 5:
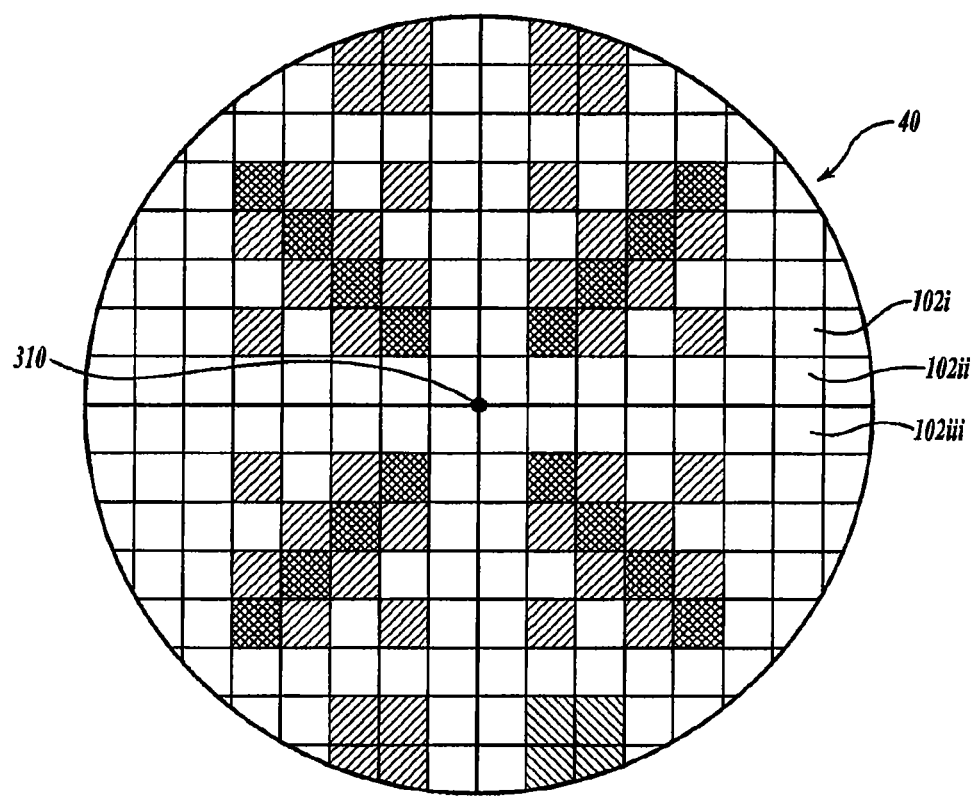
FIG. 5 illustrates a representative pixilated illumination source.

FIG. 5 shows a representative light source that is optimized to print a set of features on a semiconductor wafer. The light source 40 is divided up into a number of pixels 102$i$, 102$ii$, and 102$iii$, etc. Each pixel in the light source is assigned a brightness in accordance with the techniques described below. In the example shown in FIG. 5, the light source is generally symmetric about a center axis 310 of the light source. However, this is not required. The distribution of light in the light source is generally produced using a diffractive optical element that operates as a hologram to produce the desired light pattern from an incoming light source such as a laser or other coherent radiation source. The use of diffractive optical elements is currently preferred because the light source can be readily changed for other distribution patterns in order to expose other patterns of features on a wafer.

Figure 6:
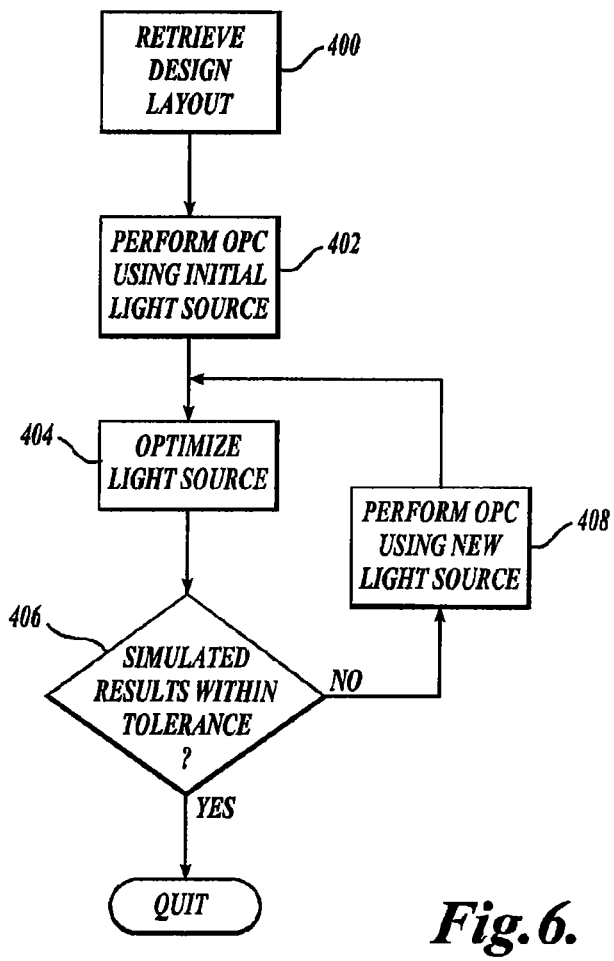
FIG. 6 illustrates a series of steps to optimize a light source and perform a resolution enhancement technique on a design layout.

FIG. 6 illustrates one possible sequence of steps in which the present invention can be used. Beginning at a step 400, a layout database or a portion thereof is retrieved by the computer system. The pattern of features from the database may form a target layer that defines the desired pattern to be created on a wafer. In other embodiments, the pattern of features may be modified by other tools, such as a design rule checker (DRC), etc., to create the target layer. At a step 402, initial resolution enhancement techniques (RETs) such as OPC calculations are performed assuming an initial distribution of light from the light source. At a step 404, the distribution of light from the light source is optimized according to the methods set forth in further detail below. The mask layout pattern used to optimize the light source will be the OPC corrected layout. At step 406, it is determined if the simulated results of the printed layout using the source optimized in step 404 are within set tolerances compared to the target layer. If not, processing proceeds to step 408, whereby additional OPC calculations are performed using the new optimized light source. This creates a revised OPC corrected layout. Processing can then return to step 404, whereby the light source illumination pattern is further optimized to print the revised OPC corrected layout data. Alternatively, processing could proceed from step 408 to step 406 and additional OPC calculations performed in a loop until it is determined that the layout will print with the desired tolerances. Once the answer to step 406 is YES, the processing can be finished.

By using the revised OPC corrected layout data as the mask layout, the mask layout and light source illumination pattern can be iteratively refined to ensure accurate printing of the desired feature pattern on a wafer. Although the flow diagram shown in FIG. 6 shows performing a RET before optimizing the light source distribution, it will be appreciated that light source optimization could be performed using an uncorrected layout description first and then using the optimized light source distribution to perform the RETs.

The source intensity is a 2D, non-negative, real valued function, which is defined inside a circle of radius σ (partial coherency). If a Cartesian coordinate system is positioned in the center of this circle, then the source can be represented as the function $$S=S(x,y)\geq 0, x^2+y^2\leq \sigma^2. \quad (1)$$

Discretization of this yields a pixel-based source representation.

$$S_s=S(x_i,y_j)\geq 0, x_i^2+y_j^2\leq \sigma^2, \quad (2)$$

where the size $\Delta x=\Delta y$ of the pixels is dictated by the number n of the discretization intervals between $-\sigma$ and $\sigma$:

$$\Delta x = x_{i+1} - x_i = \Delta y = y_{i+1} - y_i = \frac{2\sigma}{n}. \quad (3)$$

the total amount of energy (per time unit) falling onto the mask is $$E = \int\int_A S(x,y) dxdy \equiv \|S\|_1, \quad (4)$$

where the operator $\|\cdot\|_1$ is a Manhattan functional norm $l_1$, and A is a source area. The throughput of the printing system is dictated by this energy. Among otherwise equally fit sources, generally preferable is a source with the largest throughput $$E(S)=\|S\|_1 \to \max. \quad (5)$$

Another requirement for the source design is to avoid sharp spikes that can damage lenses of the photolithographic system, and generally to keep light evenly distributed across the source. This requirement can be expressed through a constraint $$\max_{x,y} S(x,y) \leq S_{max}, \quad (6)$$

or $$\|S\|_\infty \leq S_{max}, \quad (7)$$

which limits the source energies to some value $S_{max}$ that can be tolerated by lenses; the operator $\|\cdot\|_\infty$ is the Chebyshev or infinity functional norm $l_\infty$. A combination of Equation 5 and Equation 7 constitutes a constrained optimization problem $$\|S\|_1 \to \max,$$

$$\|S\|_\infty \leq S_{max} \quad (8)$$

which has an obvious solution $S(x,y)=S_{max}$, meaning that the source is uniformly lit. Equation 8 is more relevant to optimization of the source formed by hard stop apertures than by DOEs. DOE redirects light rather than blocks it, so the energy in Equation 5 does not depend on the shape of the source, but on the power of the laser. In this case the relevant formulation is $$\|S\|_1 = E_0,$$

$$\|S\|_\infty \to \min \quad (9)$$

which means that source distributions are restricted to those that are formed by the same power supply. Thus the energy E falling onto the mask is fixed ($E=E_0$), and the impact of possible spikes or non-uniformities should be minimized. The optimization of Equation 9 has the solution $S(x,y)=E_0/A$, where A is the total area of the source. Indeed, $\|S\|_\infty$ is limited by $E_0/A$ because $$E_0=\|S\|_1=\int\int Sdxdy \leq S_{max} A=\|S\|_\infty A. \quad (10)$$

In other words, it is not possible to do better in $\|S\|_\infty$ minimization than to reach $\|S\|_\infty=E_0/A$. This limit is reached when $S=E_0/A$, so $S(x,y)=E_0/A$ solves Equation 9. This is the same solution as for Equation 8, if we match constants $S_{max}(x,y)=E_0/A$.

Though Equations 8 and 9 have the same solutions (uniformly lit illumination pupil), it does not necessarily mean that they will have the same effect when added to a larger optimization problem of the pattern transfer fidelity.

The $l_\infty$ norm used in Equation 10 can be replaced by the Euclidean $l_2$ norm $$\|S\|_2 = [\int\int S^2(x,y) dxdy]^{1/2}, \quad (11)$$

which is an optimization problem. It is also less harsh in penalizing intensity spikes, which is a desirable property considering that some narrow spikes can be tolerated or mitigated by lowering the surrounding energies. Similar to Equation 10, it can be shown that the resulting optimization problem $$\|S\|_1 = E_0$$

$$\|S\|_2 \to \min \quad (12)$$

is solved by a uniform distribution $S(x,y)=E_0/A$.

Non-uniformity of the source intensity accelerates degradation of reflective and refractive elements in the optical path as far as the condenser lens. The lens coating is especially sensitive to the laser irradiation and can suffer loss of transmission. It is not uncommon to discover during hardware maintenance that the source shape has become burned into the lens coating. However, it is hard to quantify potential damage from different source shapes other than to say that the light has to be evenly and smoothly—in some sense—spread across the illumination aperture.

In addition to variations in the formalization of the requirement that are represented in Equations 9 and 12, a useful generalization comes from utilization of so-called Sobolev norms. These norms compare not only values of the functions but also values of their derivatives. Considering only the Euclidean type of Sobolev norms and restricting the comparison to the first and second derivatives, the Sobolev metric $\|\cdot\|_{sob}$ is calculated as follows:

$$\|S\|_{sob} = [\alpha_0^2 \|S\|_2^2 + \alpha_1^2 \|L_1 S\|_2^2 + \alpha_2^2 \|L_2 S\|_2^2]^{1/2}, \quad (13)$$

where $\alpha_0, \alpha_1, \alpha_2$, are metric constants, $L_1$ is an operator of the first derivative, and $L_2$ is an operator of the second derivative. Varying the metric constants, source smoothing is achieved by lowering the intensity variability, and/or lowering the first derivatives, and/or lowering the second derivatives. Though not all combinations of metric constants make sense: if $\alpha_0 = \alpha_1 = 0$, $\alpha_2 > 0$, then the following minimization problem arises in the Sobolev metric $$\|S\|_1 = E_0$$

$$\|S\|_{sob} \to \min \quad (14)$$

It yields, for example, a non-uniform linear solution $S(x, y) \propto 2 + x + y$. This intensity distribution is smooth, but does not evenly spread light across the source. Thus, it is reasonable to limit the metric constants to those that satisfy $$\alpha_0^2 + \alpha_1^2 > 0 \quad (15)$$

Under the conditions of Equation 15 the minimization problem of Equation 14 has the same solution: $S(x, y) = E_0/A$ as in Equations 12 and 9. The problem of Equation 12 is a special case of Equation 14 when $\alpha_0 = 1$, $\alpha_1 = \alpha_2 = 0$. Equation 14 is a part of the general optimization problem in addition to the image fidelity objective.

The pixel-based source representation can naturally be used in satisfying Equation 14. Notions of evenly or smoothly lit source do not fit into the frameworks of contour-based representations 30 or arch-based representations 20 shown in FIG. 1.

For dense gratings normalized image log slope (NILS) is proportional to the number of captured diffraction orders. This indicates that spectral fidelity as an optimization metric relates to NILS and thus to the optimization of exposure latitude.

Image quality can be judged by modulation (or Michelson contrast)

$$M_c = \frac{I_{max} - I_{min}}{I_{max} + I_{min}}. \quad (16)$$

The maximum modulation may be achieved by choosing to light those regions on the source that shift the important components of the mask spectrum into the pupil. Similarly, simulated annealing may be used to optimize radially-dependent sources. The shortcoming of this objective is that the modulation as a metric of image quality is relevant only to simple gratings or other highly periodic structures. For phase shifting masks (PSM), one can achieve maximum modulation of 1 just by capturing two interfering ±1 orders in the pupil, which zeros $I_{min}$. However, this does not faithfully reproduce mask features because high spectral components are ignored. Equation 16 is relevant for simple harmonic signals, where it serves as a measure of signal-to-noise ratio. It is questionable for judging printability of complex patterns, or even isolated lines, with Weber contrast $W_c = (I_{max} - I_{min})/I_{min}$ being a better metric.

The image fidelity is a more universal metric than modulation. To establish this metric, we can start with the notion of the layout data (or OPC corrected layout data) layer, which represents the desired pattern on the wafer. For this layer we can build a characteristic 2D function, which is 1 inside the layer shapes and 0 outside. This function is an ideal image, or an ideal distribution of the light intensity on the wafer, $$I_{deal} = I_{ideal}(x, y). \quad (17)$$

The ideal image can also be expressed through the complex-valued mask transmission function m(x, y) as $$I_{ideal} = m(x, y) m^*(x, y), \quad (18)$$

where the asterisk denotes a complex conjugation.

The optimization objective F can be formed as a Euclidean norm $l_2$ of the difference between the real I(x,y) and ideal images;

$$F = \|I - I_{ideal}\|_2 = \{\iint [I(x,y) - I_{ideal}(x,y)]^2 dx dy\}^{1/2}. \quad (19)$$

F is called image fidelity. As an optimization objective, this integral was first described by Vallishayee and called contrast. Using the Parceval theorem, which states that $l_2$ norms are equal in the space and in the frequency domains, Equation 19 to the frequency domain:

$$F = \|I - I_{ideal}\|_2 \quad (20)$$
$$= \|\hat{I}(k_x, k_y) - \hat{I}_{ideal}(k_x, k_y)\|_2$$
$$= \left[\sum_{i,j} |\hat{I}(k_{xi}, k_{yj}) - \hat{I}_{ideal}(k_{xi}, k_{yj})|^2\right]^{1/2}, ..$$

where $k_x, k_y$, are spectral coordinates; i,j are summation indices of the discrete spectrum; the circumflex denotes a Fourier transform. The equality in Equation 20 means that the image and spectral fidelities are the same metrics when expressed in Euclidean norm.

An off-axis illuminator design is often conducted in the spatial frequency domain. In the frequency domain, image intensity for a partially coherent system and a periodic mask transmission is defined by the Hopkins summation $$\hat{I}(k_{xi}, k_{yj}) = \sum_{f,g} \hat{h}(f, g, k_{xi} + f, k_{yj} + g) \hat{m}(f, g) \hat{m}^*(k_{xi} + f, k_{yj} + g), \quad (21)$$

where $\hat{h} = \hat{h}(f, g, p, q)$ are transmission cross-coefficients (TCCs). In the frequency domain, the ideal image can be obtained from Equation 18 using the Borel convolution theorem to convert the multiplication to the following convolution:

$$\hat{I}_{ideal} = \sum_{f,g} \hat{m}(f, g) \hat{m}^*(k_{xi} + f, k_{yj} + g). \quad (22)$$

Subtracting Equations 21 and 22, the expression for the spectral fidelity is in the form:

$$F = \|\hat{I} - \hat{I}_{ideal}\| = \|\Sigma(\hat{h} - 1) \hat{m} \hat{m}^*\|. \quad (23)$$

This expression can be minimized by attempting to setting components of $\hat{h}$ to 1. For the high-frequency components of the mask transmission this is an unattainable goal, because the optical system is band-limited and all the correspondent high-frequency TCCs must necessarily be 0. Thus, only a limited number of TCCs can be controlled, which means that the high-frequency elements can be removed from the sum (4) and an objective function in the form of a truncated summation considered. In the canonical optical coordinates and for a clear circular unaberrated pupil, each TCC value $\hat{h}(f, g, p, q)$ is the area of intersection of two shifted pupils (unity circles) with centers at $(f, g)$ and $(p, q)$, and a source area A, normalized by the source area. Thus, $\hat{h}(f, g, p, q)$ is equal 1 when the source area is fully encircled by both pupils. Using this simple geometrical consideration, a few elements (a few orders) can be "hand-picked" from the truncated sum of Equation 21 to find the source area as a combination of intersections of correspondent unity circles, or combination of archels. In a more rigorous way, the sum of Equation 21 can be rewritten in a matrix form and minimized to find $\hat{h}(f, g, p, q)$, then the source can be constructed out of archels.

In the spatial domain, it is often beneficial to consider the following weighted image fidelity error $$F_w = \|I - I_{ideal}\|_{w2} = \| \sqrt{w \cdot (I = I_{ideal})}) \|_2 = [\iint w \cdot (I = I_{ideal})^2 dx dy]^{1/2}. \quad (24)$$

where the weighting function $w = w(x, y)$ is formed to emphasize important design features and regions (gates, landing pads, etc.). The weighting function can be formed in such way as to effectively make image comparison one-dimensional by using a 2D characteristic function, which equals 0 everywhere except some 1D "cutlines" where it is infinite, In this case image fidelity in Equation 24 becomes a 1D integral in the form $$F_{1D} = \left[ \int \int [I(z) - I_{ideal}(z)]^2 dz \right]^{1/2}, \quad (25)$$

where coordinate z is a distance along the cutline. Comparison of images along a outline or multiple cutlines simplifies the optimization problem and speeds up computer calculations at the expense of comprehensiveness and perhaps accuracy of some 2D feature reproductions. Cutlines have been used to maximize the focus latitude given fixed exposure latitude.

Image fidelity can be expressed in other than $l_2$ norms. If the Chebyshev norm $l_\infty$ $$F_\infty = \|I - I_{ideal}\| = \max_{x,y} |I - I_{ideal}| \quad (26)$$

is used for this purpose, then the optimization minimizes the maximum difference between ideal and real images, rather than the average difference, as in Equation 24. Equation 26 is a justifiable metric, because printing limits are dictated by the regions of the worst printability, e.g., those areas where ideal image reproduction is the worst and the maximum difference between ideal and real images is observed. Chebyshev fidelity in Equation 26 has two drawbacks. First, it is harder to minimize $l_\infty$ than $l_2$. Difficulty grows with the number of grid points used in computer simulations for I. The solution may not be unique or slow convergence is observed. Second, the Chebyshev norm is not equivalent to any metric in the frequency domain, as in Equation 24. Relationships between spectral and frequency norms are governed by the Hausdorff-Young inequality. It states that the following inequality holds between norm $l_p$ ($1 \le p \le 2$) in the space domain and norm $l_q$ ($q = p/(1-p)$) in the frequency domain $$\|\hat{I}\|_q \le \|I\|_p. \quad (27)$$

When $p=1$, $q=\infty$, it is inferred that the Manhattan norm fidelity $l_1$, in the space domain limits the Chebyshev fidelity in the frequency domain $$\|\hat{I}\|_\infty \le \|I\|_1.$$

However, the inverse is not true, so minimization of Equation 26 does not limit any fidelity error in the frequency domain.

A useful generalization of the fidelity metrics of Equations 24 and 26 can be achieved by considering Sobolev norms. For practical purposes the comparison can be limited to the first derivative only. Using linear combination the first derivative and Equation 24, Sobolev fidelity (squared) is $$F_{sob}^2 = \alpha_0^2 \|I - I_{ideal}\|^2 + \alpha_1^2 \|L_1[I - I_{ideal}]\|^2. \quad (28)$$

The metric coefficient $\alpha_1$, defines the weight for the image slope fidelity. Equation 28 states that ideal and real images are close to each other when their values are close and the values of their first derivatives are close.

An important practical case of Equation 28 is when $\alpha_0 = 1$, $\alpha_1 = 1$, e.g., when only first derivatives are compared in the $F_{sob}$ metric. The first derivative of the ideal image is 0 almost everywhere in the wafer plane except a thin band around edges of the target layer where this function is infinite (or very large, if the ideal image is slightly smoothed). Under these conditions minimization of $F_{sob}$ is equivalent to the maximization of the slope of the real image in a thin band, which relates to the problem of maximization of the exposure latitude. Without being formally stated, this objective—expressed in the norm $l_\infty$—is used herein.

To optimize for the best process window, rather than for exposure latitude only, it is important to account for defocus effects in the objective function, which is usually done by averaging it through focus values $f_k$, so that instead of Equation 24 the following is optimized $$F_w^f = \sum_k F_w^{f_k}, \quad (29)$$

where $F_w^{f_k}$ is the image fidelity calculated for focus $f_k$. The averaging can be carried out for only two values, for some "plus" and "minus" defocus positions so that $$F_w^f = F_w^+ + F_w^-.$$

To reduce optimization run time further, an approximate condition $F_w^+ \approx F_w^-$, and carry optimizations off-focus $$F_w^f = F_w^+ = \|I^+ - I_{ideal}\|_{w2}, \quad (30)$$

Here $I^+$ is an off-focused wafer image. Numerical experiments show that Equation 30 out of focus and Equation 29 averaging optimization results are hard to differentiate, so that the run time overhead of the averaging technique is not justified. However, the results exhibit a strong dependence on the plus defocus position, so that in each application careful exploration of this value should be conducted, guided by considerations for the required or expected depth of the focus. In the examples described below, half of the focal budget for the "plus" defocus position is used.

The optimization objective of source smoothness of Equation 14 are combined with the weighted off focus image fidelity of Equation 30 are combined to state the following optimization problem:

$$S \geq 0$$

$$\|S\|_1 = E_0$$

$$\|S\|_{sob} \to \min$$

$$F_w^+ = \|I^+ - I_{ideal}\|_{w2} \to \min \tag{31}$$

It is convenient to introduce the normalized source intensity $$r = \frac{S}{E_0}.$$

Then conditions in Equation 31 can be expressed using this normalized quantity as $$r \geq 0$$

$$\|r\|_1 = 1$$

$$\|r\|_{sob} \to \min$$

$$\|I^+ - I_{ideal}\|_{w2} \to \min$$

This problem has two mutually exclusive minimization objectives that are combined in some proportion γ to state a correct minimization problem. This leads to the following formulation $$r \geq 0$$

$$\|r\|_1 = 1$$

$$\gamma^2 \cdot \|I^+ - I_{ideal}\|_{w2}^2 + (1-\gamma)^2 \cdot \|r\|_{sob}^2 \to \min \tag{32}$$

The optimization proportion $0 \leq \gamma \leq 1$ balances two objectives, the image fidelity and source smoothness. When γ=1 the image fidelity is optimized alone, and at the other extreme at γ=0 a trivial problem of smoothing the source without paying attention to the image fidelity is obtained. Equations 32 constitute a constrained quadratic optimization problem for the normalized source intensity r=r(x, y).

The solution of Equation 32 is reduced to a sequence of non-negative least square (NNLS) optimizations using the Courant style reduction of a constrained to an unconstrained problem, and subsequent discretization of the source and image intensities. Multiplying the equality condition in Equation 32 by a large positive number, $C_n$, and adding it to the minimization objective, results in $$r \geq 0$$

$$\gamma^2 \cdot \|I^+ - I_{ideal}\|_{w2}^2 + (1-\gamma)^2 \cdot \|r\|_{sob}^2 + C_n^2 \cdot (\|r\|_1 - 1)^2 \to \min \tag{33}$$

This is solved for a sequence of increasing $C_n$ values, which forces the error of the constraint $\|r\|_1 = 1$ to be sufficiently small for some large n.

The minimization objective in Equation 33 is a functional of the source r=r(x, y). To find a form of this dependency we use the Abbe approach to describe the imaging system. Consider a spherical wave of amplitude $a_s$ coming from the source point $\vec{k}_s = (k_x, k_y)$. The source intensity at this point is $S_s = a_s a_s^*$. This wave is incident to the object as a plane wave $$a_{oi} = a_s \exp(i\vec{k}_s \vec{x}).$$

This amplitude is modulated by the mask, so that the transmitted amplitude is $$a_{ot} = a_s \exp(i\vec{k}_s \vec{x}) m,$$

where m is a complex transmission of the mask. Complex amplitude $a_p$ that is arriving at the pupil plane is the Fourier transform of the amplitude $a_{ot}$ in the object plane:

$$a_{pi} = F[a_{ot}] = a_s F[m\exp(i\vec{k}_s \vec{x})].$$

This is multiplied by the pupil function, so that the transmitted amplitude is:

$$a_{pt} = a_{pi} P = a_s F[m\exp(i\vec{k}_s \vec{x})] P. \tag{34}$$

The image of the object is then formed at the image plane by inverse Fourier transformation, so that $$a_i = F^{-1}[a_{pt}] = a_s F^{-1}[F[m\exp(i\vec{k}_s \vec{x})] P]. \tag{35}$$

By applying the shift theorem for the Fourier transformation, the result is $$F[m\exp(i\vec{k}_s \vec{x})] = \hat{m}(\vec{k} - \vec{k}_s),$$

where $\hat{m} = F[m]$ is the Fourier transform of the mask. With this, the amplitude at the image plane is $$a_i = a_s F^{-1}[\hat{m}(\vec{k} - \vec{k}_s) \cdot P]. \tag{36}$$

The shift theorem is again applied to the inverse Fourier, resulting in $$a_i = a_s \exp(i\vec{k}_s \vec{x}) F^{-1}[\hat{m} \cdot P(\vec{k} + \vec{k}_s)]. \tag{37}$$

The light intensity in the image plane is a sum of the amplitude modules normalized to the source energy $$I = \sum_s a_i a_i^* \Big/ \sum_s a_s a_s^* = \sum_s a_s^2 |F^{-1}[\hat{m} \cdot P(\vec{k} + \vec{k}_s)]|^2 \Big/ \sum_s a_s a_s^*. \tag{38}$$

The Abbe formula of equation 38 is rewritten in a convolution form. Starting with equation 37 and apply the Borel convolution theorem, yields $$F[fg] = F[f] \otimes F[g]. \tag{39}$$

This yields $$a_i = a_s \exp(i\vec{k}_s \vec{x}) F^{-1}[\hat{m} \cdot P(k+k_s)] = a_s \exp(i\vec{k}_s \vec{x}) m$$
$$\otimes (F^{-1}[P] \cdot \exp(-i\vec{k}_s \vec{x})). \tag{40}$$

Introducing Abbe kernels $$K_s = F^{-1}[P] \cdot \exp(-\vec{k}_s \vec{x}), \tag{41}$$

the image plane amplitude can be represented as a convolution operation $$a_i = a_s \exp(i\vec{k}_s \vec{x}) m \otimes K_s. \tag{42}$$

Using pointwise summation over the source produces the following expression for the image intensity $$I = \sum_s a_s a_s^* |m \otimes K_s|^2 \Big/ \sum_s a_s a_s^* = \sum_s S_s \cdot |m \otimes K_s|^2 / \|S\|_1. \tag{43}$$

The convolution form of the image integral speeds up calculations when being used with the lookup table approach. Using constraint $\|S\|_1 = E_0$ from equation 12, the image inten sity in equation 43 can be expressed through normalized source intensities $$I = \sum_s r_s \cdot |m \otimes K_s|^2. \quad (44)$$

The linearity of image intensity as a function of source pixels simplifies the solution of equation 33, the minimization can be reduced to solving—in a least square sense—a system of linear equations. To deduce this system, the image on a wafer is discretized and all image pixels are sequentially numbered, which yields the image vector I and allows us to express equation 44 in a matrix form $$I = Tr, \quad (45)$$

where the source vector $r = \{r_s\}$ and the components of the transformation matrix T can be computed from the convolutions in equation 44. Equation 45 can be substituted into equation 33, resulting in the following optimization problem for the source vector r $$r \geq 0$$

$$\|Gr - a\|_2 \to \min \quad (46)$$

where matrix G and vector a consist of the following blocks $$G = \begin{pmatrix} \gamma \sqrt{w} \, T \\ (1-\gamma)\alpha_0 E \\ (1-\gamma)\alpha_1 L_1 \\ (1-\gamma)\alpha_2 L_2 \\ C_n \end{pmatrix}, \, a = \begin{pmatrix} \gamma \sqrt{w} \, I_{ideal} \\ 0 \\ 0 \\ 0 \\ C_n \end{pmatrix} \quad (47)$$

The optimization problem of equation 46 is a standard NNLS problem, with well-established methods and software packages to solve it, including a MATLAB routine NNLS. Equation 46 is solved for a sequence of increasing values of $C_n$ until the condition $\|r\|_1 = 1$ is satisfied with required accuracy.

Example 1

Periodic Array of Contacts, Alternating PSM

Figure 7:
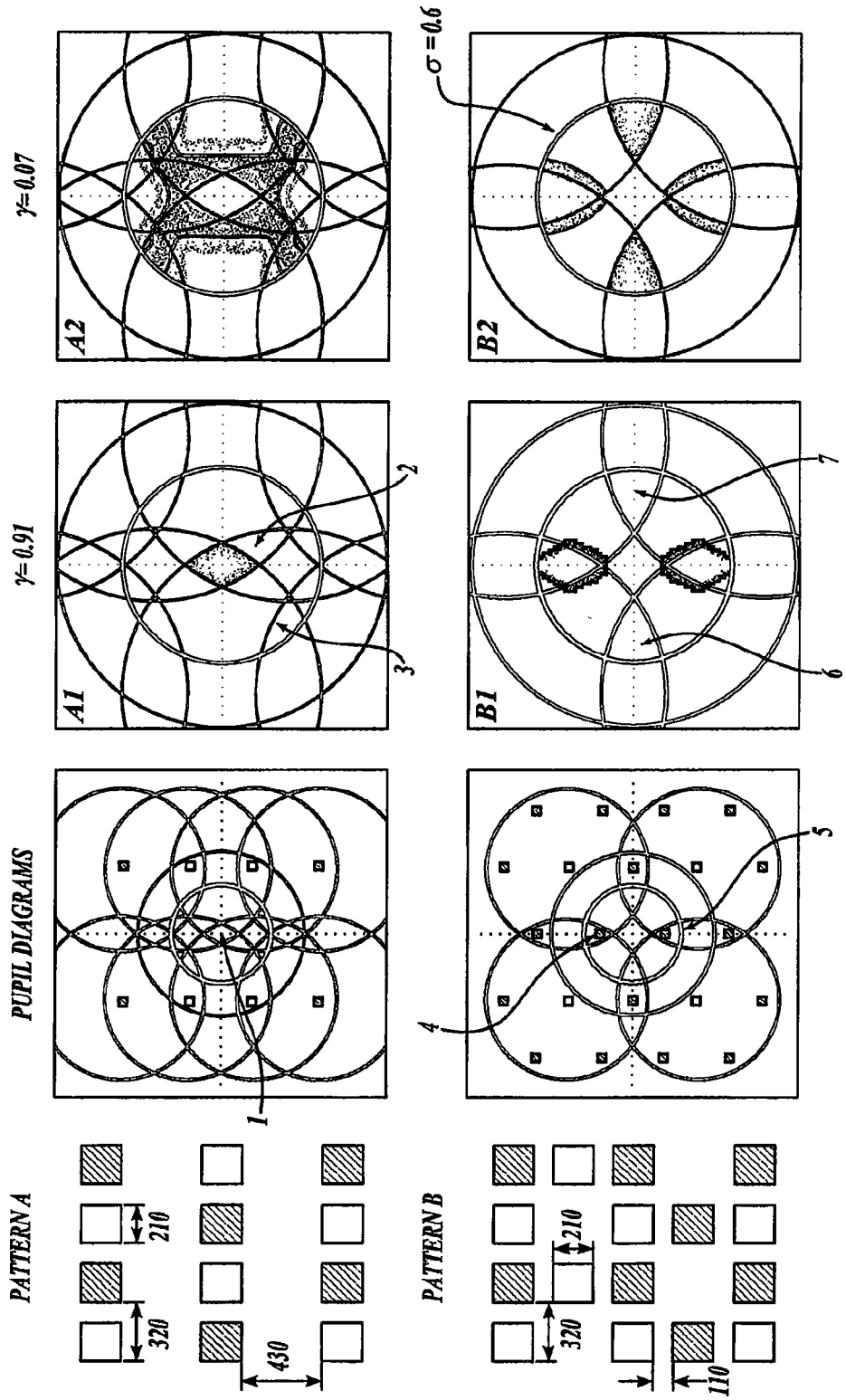
FIG. 7 illustrates a number of contact patterns A and B and 180 degree phase-shifted regions and corresponding diffraction diagrams.
Figure 8A:
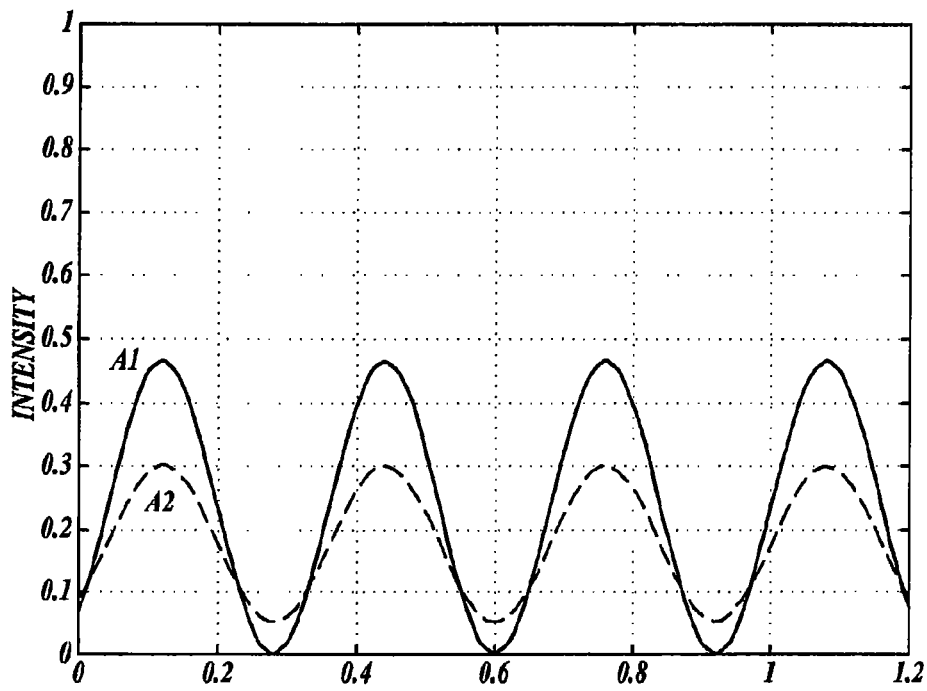
FIGS. 8A and 8B are intensity profiles taken along horizontal cutlines in the middle of the contact patterns A and B shown in FIG. 7.
Figure 8B:
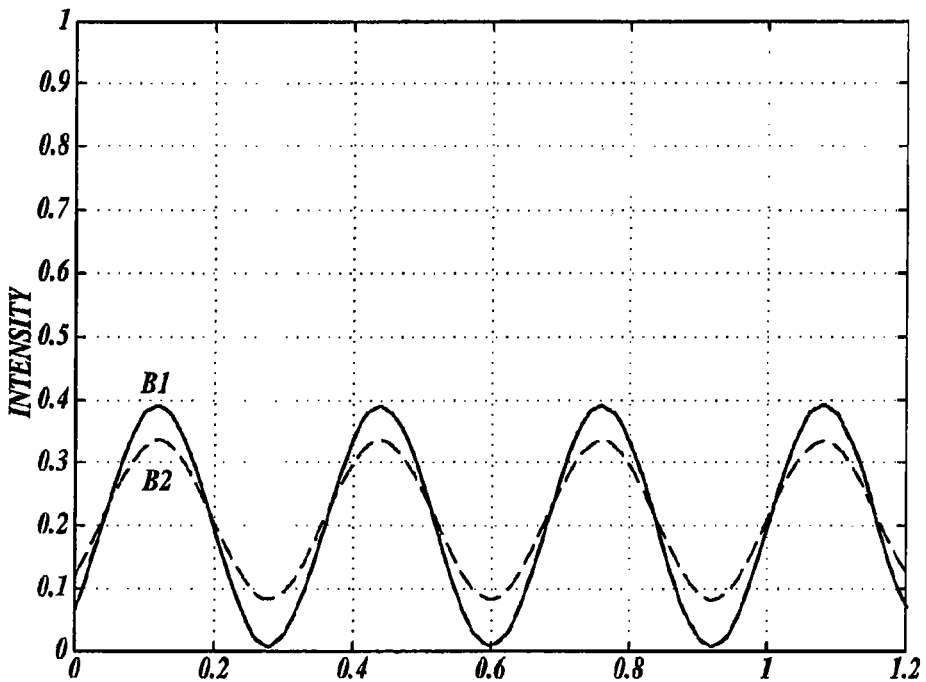

Geometries and process conditions for our first two examples are borrowed from the Burkhardt paper. Contact patterns A and B are shown in FIG. 7. They are composed of clear and 180° phase shifted, 210 nm contact holes that are imaged on a dark background using λ=248 nm and NA=0.5. Contact pattern A has 640 nm pitch in the y and 320 nm pitch in the x direction. Contact pattern B is less regular, with a basic pitch of 320 nm in both directions. Pupil diagrams are shown in the second column of FIG. 7. Positions of diffraction orders are marked by small squares, with their brightness being proportional to the order amplitudes. Thick white circles show the source area σ=0.6.

For the pattern A, four light squares represent the major diffraction orders that are larger than the four minor diffraction orders, marked as the darker squares and positioned farther from the x-axis. Around each of the eight shown diffraction orders a unit circle is erected to show a shifted pupil. These circles break the source of size σ=0.6 into 27 archels, including 1, 2, and 3. Archels 1 and 2 maximize TCCs between the four major orders, while archel 3 maximizes TCCs between four minor and four major orders. Inset A1 shows the optimum source when the balance parameter γ is large, γ=0.91. The source mainly consists of a bright central archel 1 in a rhombic shape. When γ is small and source smoothing is increased (γ=0.07, see inset A2 of the FIG. 7), light spreads from the central archel and an increase in brightness of archels 2 and 3, resulting in a source shape somewhat reminiscent of the handwritten letter x.

Four major diffraction orders and their 9 archels for the pattern B are shown in a pupil diagram in the second row of the FIG. 7. Optimum source B1 for γ=0.91 is a vertical dipole, mainly formed by archels 4 and 5. When source throughput and smoothness are increased at γ=0.07, two additional archels 6 and 7 are lit.

We showed four optimal source designs A1, A2, B1, and B2. In the original Burkhardt study, only two of them, similar to A1 and B2, were found and analyzed. This suggests that a comprehensive optimization of this study or a similar one is required even for highly periodic patterns, or else some advantageous designs may be overlooked.

Example 2

SRAM Design 1, Binary Mask

Figure 14:
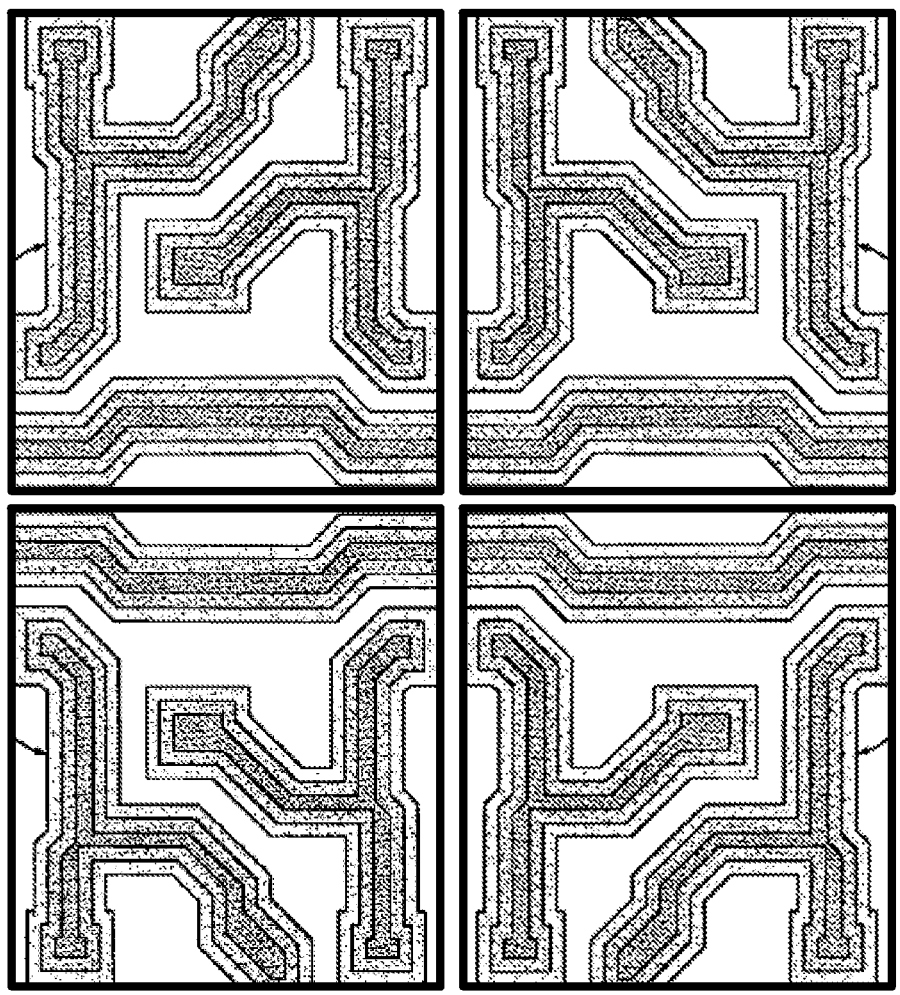
FIG. 14 illustrates an example of a possible mirrored tiling of a cell.

In this section we consider a 130 nm SRAM design from the Brist paper. Geometry of this SRAM cell is much more complicated than for the contacts from the previous section and cannot be tackled by a simple analysis of diffraction orders. The cell from FIG. 9 tiles large region of the SRAM design in a way that is called in geometry wallpaper tiling group pmm. A fundamental cell of this tiling consists of four mirrored patterns of FIG. 9, with symmetries along the vertical and horizontal axis. FIG. 14 depicts an example of a possible mirrored tiling of one of the cells depicted in FIG. 9, with symmetries along the vertical and horizontal axis. These symmetries reduce the solution of the optimization problem to one quadrant of the source, with subsequential mirroring of results along vertical and horizontal axes. Simulation runtime can be reduced farther by simulating one-fourth of the fundamental cell, then filtering its spectrum to induce even periodic boundary conditions in both the vertical and horizontal directions. The optimization domain is chosen to be a circle of σ=0.8 and the balancing parameter γ is 0.38.

Two different weighting styles for the image fidelity (24), including a uniform edge weighting and a gate weighting, are compared. For the uniform edge weighting, a layer that covers the edges of the polygons as a 40 nm wide uniform band is created. Image fidelity is weighted 36 times larger inside this band than outside. The correspondent optimized source, C1, is shown in the first row of FIG. 9. C1 consists of 12 peripheral poles lying inside the annulus 0.7<σ<0.8. The gate weighting is shown in the second row of the same figure. The gate weighting layer (weight 36) covers six gate regions, where it is important to control fidelity more accurately than in the rest of the pattern (weight 1). Changes in the weighting style substantially affected source configurations: the two vertical poles disappear, while the remaining ten poles spread evenly across the periphery. In addition to the main 10 poles, a weak quadrapole can be seen, with two horizontal poles at σ≈0.65 and two vertical poles at σ≈0.45.

Example 3

SRAM Design 2, Attenuated Mask

Figure 13:
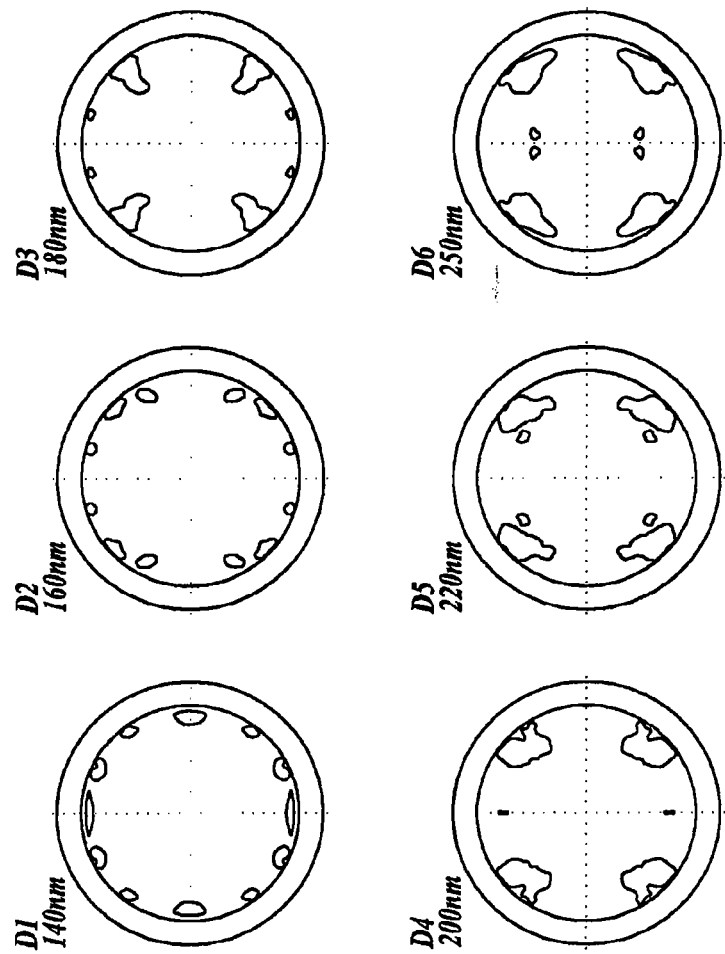
FIG. 13 illustrates various illumination patterns for an SRAM cell scaled to different sizes.
Figure 13:
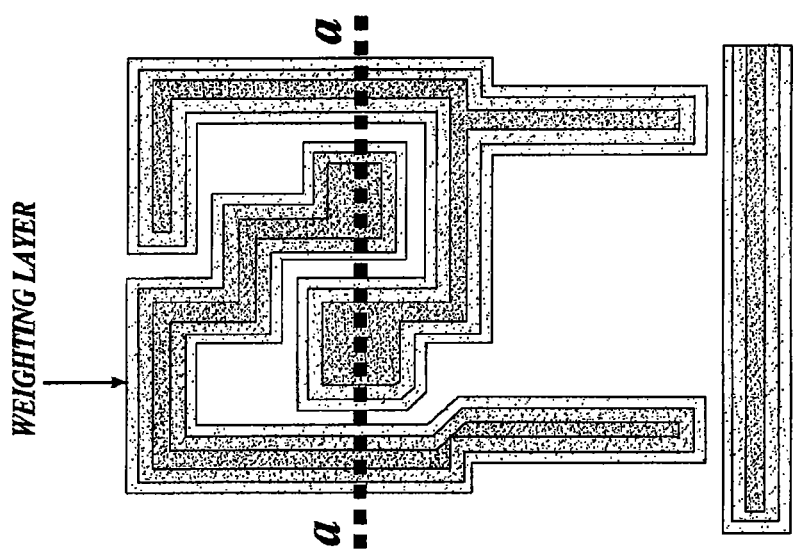

In this example the SRAM pattern and process conditions are similar to the Barouch paper. We optimize the source for the SRAM cell shown in FIG. 13 with the purpose of comparing contour-based, as in the Barouch paper, and pixel-based optimization results. A uniform weighting style is chosen with the weight 32, balance parameter γ is 0.38, and optical conditions are λ=248 nm, NA=0.5, σ=0.8.

Figure 9:
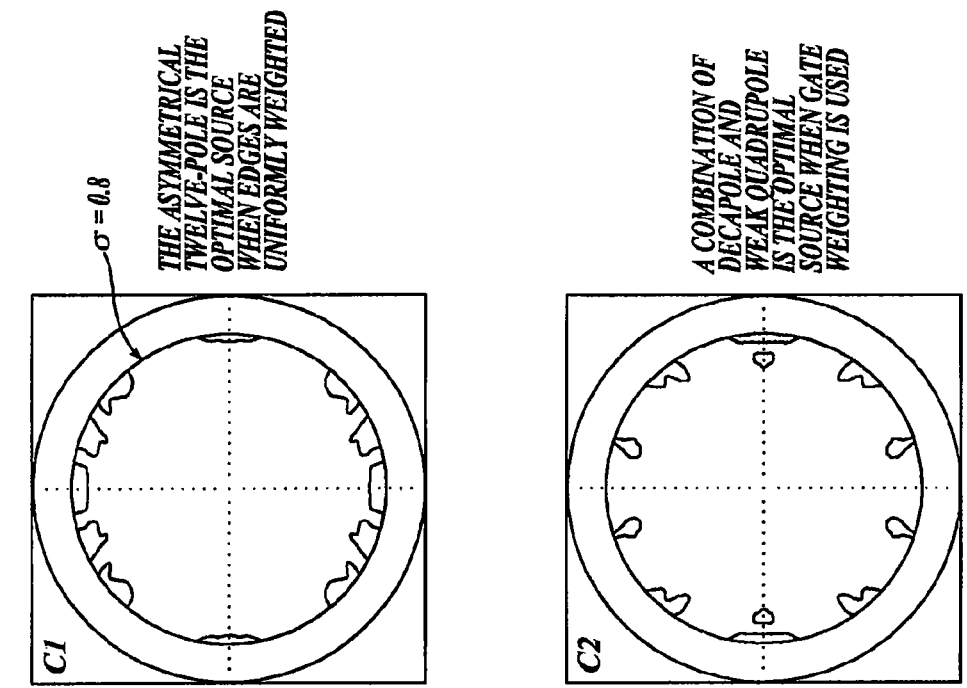
FIG. 9 illustrates an optimized illumination pattern for an SRAM cell with a uniform weighting and where the gates are weighted.
Figure 9:
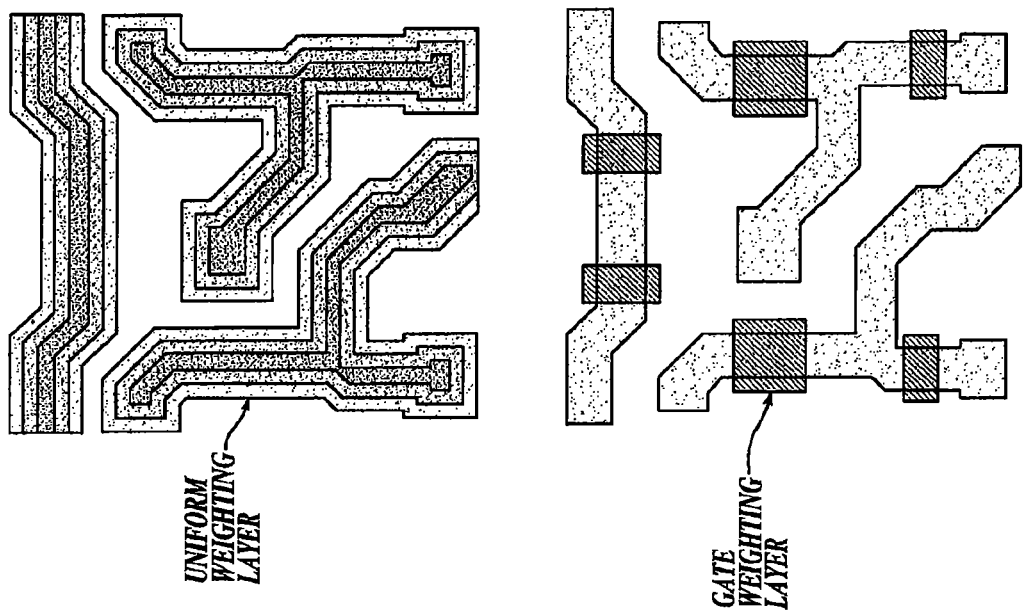

Optimizations were run for the scaled designs with 140 nm, 160 nm, 180 nm, 200 nm, 220 nm, and 250 nm feature sizes. The resulting source configurations D1, D2, . . . , D6 are shown in FIG. 9 as contours of 0.25 intensity levels. For the 250 nm design, the source D6 is a combination of the diagonal quadrapole and a weak vertical dipole. This configuration is different from the one found in the Barouch paper, which looks like an annulus of 0.6 and 0.72 radii. Simulations along the horizontal cutline a-a through the center of the cell show potential superiority of D6 in delivering better image slopes. At the threshold 0.3, we get the following intensity slopes (in 1/micron): 4.6, 3.3, 3.4, 3.9, 4.0, 3.7, 3.8, and 3.4, while the best illumination in the Barouch paper results in 4.3, 3.1, 3.3, 3.3, 3.4, 3.6, 3.6, and 3.4, which is on average 7% smaller. However, it is not completely clear whether this difference is mainly due to the difference in source representation, or caused by the other factors, like optimization objective, defocus settings, different boundary conditions, etc.

With a decrease in feature size, the bright spots undergo non-trivial topological and size transformations. From D6 to D5, vertical dipole elements move to the periphery and then merge with the quad elements in D4. From D4 to D3 the quad elements stretch to the center and narrow; a secondary vertical quad emerges. D2 and D1 are 12-poles, with bright spots between σ=0.8 and σ=0.68. D1 poles are rotated 15° from D2 poles.

This example highlights the shortcomings of the contour-based source optimization. While it is appropriate for shaping the predefined bright spots, it misses beneficial bright spots outside of the initial, predefined topology.

Example 4

Contact Pattern for 0.11 Micron Design

Figure 10:
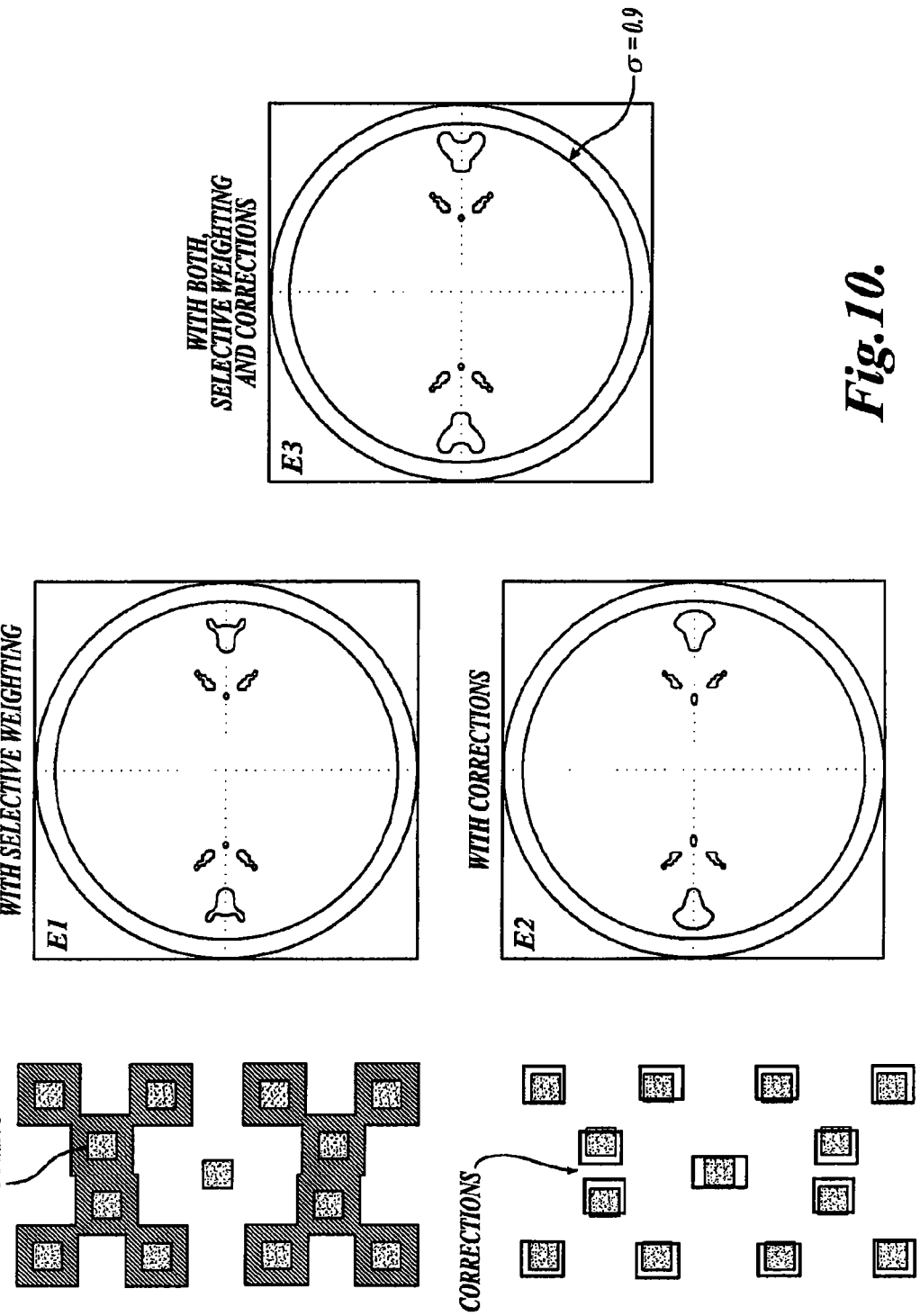
FIG. 10 illustrates optimized illumination patterns for a pattern of features with selective weighting, with OPC corrections and with selective weighting and corrections.

The semi-dense contact pattern of this example is shown in FIG. 10. Contacts of size 110 nm are printed with a binary mask on a dark background, using λ=193 nm, NA=0.63, and σ=0.9. Optimizations are conducted with the balancing parameter γ=0.91. First, a selective weighting style where only densely placed contacts are heavily accentuated with a weight of 64 is used, while the weighting layer does not cover the isolated contact in the middle. The printing fidelity of this contact is left to be improved by the proximity correction procedure, which is an easy task, because plenty of room is left even for large corrections. The resulting source, E1, can be characterized as a horizontal dipole with "whiskers" of bright archels at x=±0.5. With increased smoothing at γ=0.56, the dipoles grow in size and join the "whiskers" (this source is not shown). Second, the optical correction procedure is incorporated into the optimization loop so that the source and mask are optimized simultaneously. Looping over the source optimizations and the mask corrections results in a convergent process. The resulting solution delivers the best image fidelity by means of both source and mask modifications. When contact holes are not weighted, the iterations yield source configuration E2, which has larger and rounder dipole elements than E1. When the weighting and corrections are used together the iteration procedure converges to the source E3, with distinguished V-shaped dipoles.

Example 5

Quadrapole Optimization

Pole smoothing of quad illuminations was proposed in the Smith, Zavyalova paper to mitigate proximity effects. It was done outside of the source optimization procedure using the Gaussian distribution of intensity. The optimization problem of equation 46 naturally incorporates the smoothing constraints and thus can be used to smooth the illumination poles in an optimal way. In this example, the process conditions and pattern from the SRAM design I example are reused, but changed the optimization domain to a diagonal quadrapole between circles of σ=0.47 and σ=0.88. The Sobolev norm parameters in equation 46 are chosen to be $\alpha_0=0$, $\alpha_1=0$, $\alpha_2=1$, so that the second derivative of the source intensity serves as a smoothing factor.

Figure 11:
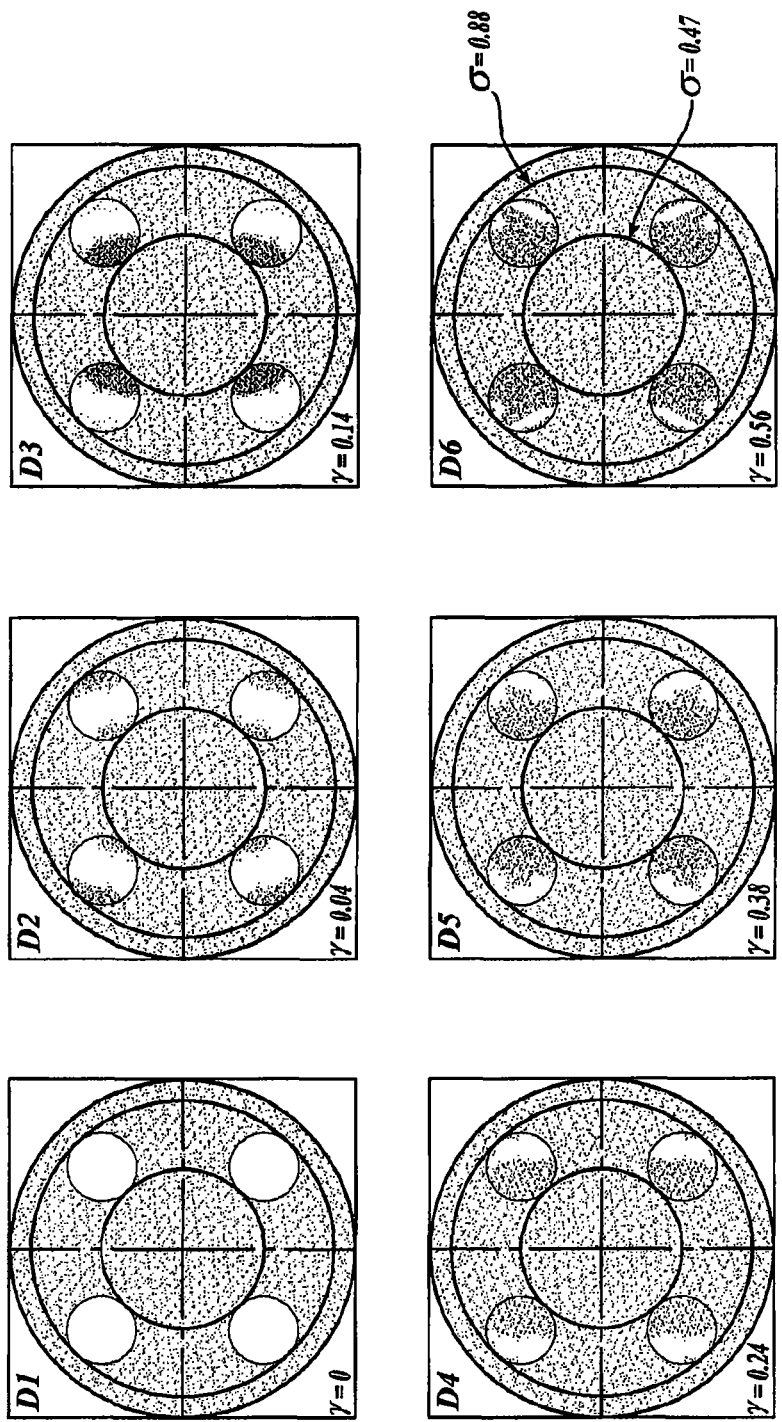
FIG. 11 illustrates smoothed versions of an original quadrapole illumination D1 in order of decreasing smoothing.
Figure 12:
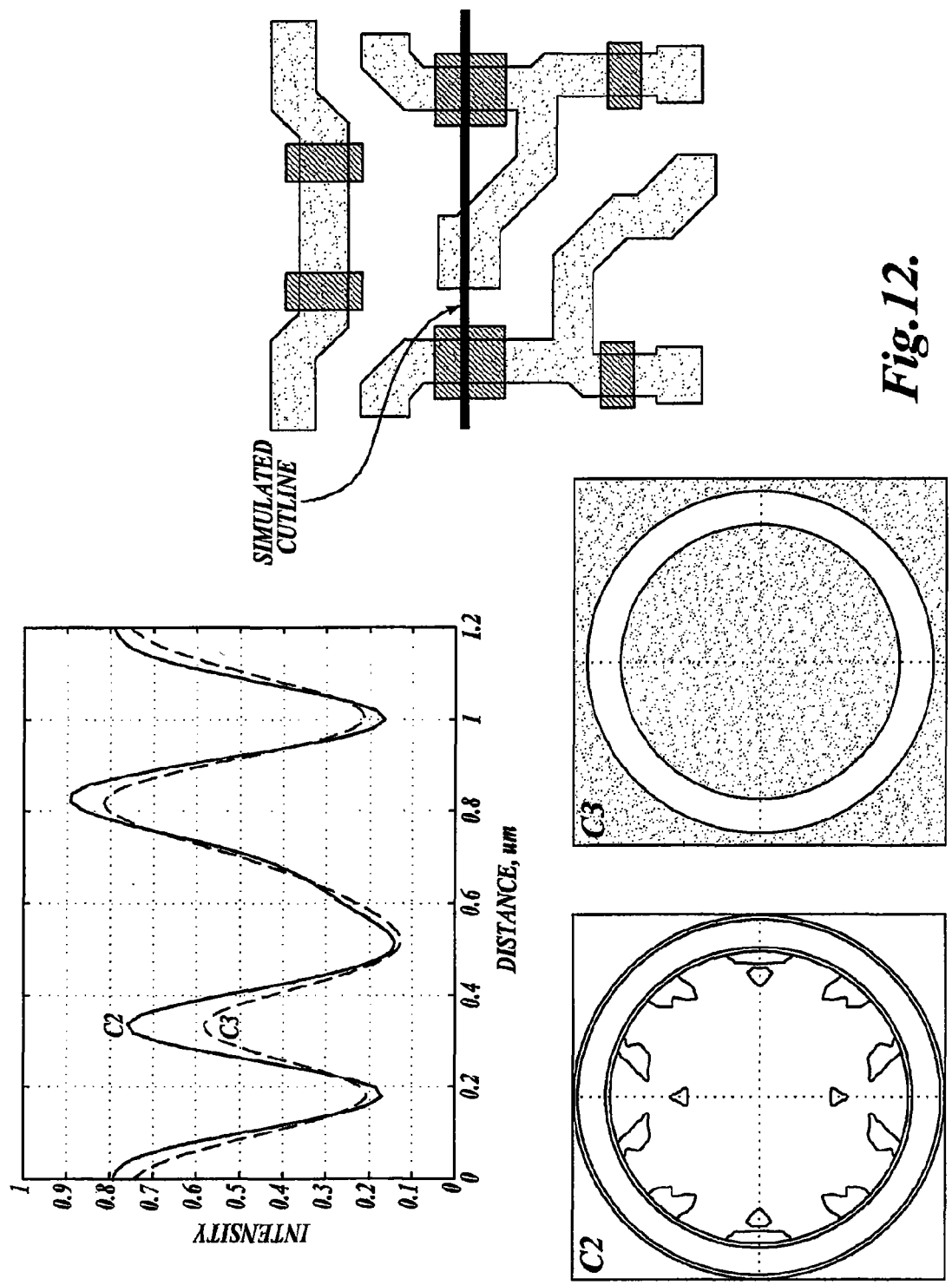
FIG. 12 illustrates a graph of intensity along a cut line in a cell for sources C2 (pixel-based optimization) and C3 (parametric optimization)

Results of optimization are shown in FIG. 11 for six values of the balancing parameter γ: 0, 0.04, 0.14, 0.24, 0.38, and 0.56. Initial uniformly distributed intensity of the source map D1 becomes non-uniform with introduction of the fidelity objective as a small portion of the whole objective function in D2. The inner portions of the poles become darker and then portions of the poles completely disappear in D3. Sources D4, D5, and D6 are too dark to be recommended as smoothed replacements of the original illumination. A reasonable compromise between smoothness and fidelity is source D2, which is still a quadrapole but the light inside the poles is redistributed in a way that benefits the SRAM printing fidelity.

As can be seen, the present invention provides a uniform, norm-based approach to the classification of optimization objectives. The image fidelity in the frequency and in the space domains and expressed through different functional norms are compared. The Sobolev norm is proposed for the throughput side-constraint. In one embodiment, the weighted Euclidean image fidelity is proposed as a main optimization objective and the averaging techniques to account for the defocus latitude are discussed. In addition, in one embodiment the off-focus optimization is adopted to save run time. A strict formulation of the source optimization problem is described and one solution method is developed as a reduction to a sequence of NNLS problems. Comparing the results for simple periodic structures indicates the methods of the present invention are in good agreement with the previously found archel-based results. With the present invention, new advantageous source designs are found, which demonstrate importance of the comprehensive optimization approach. Twelve- and ten-pole source shapes are found as the optimum source configurations for the SRAM structures. In some situations, the advantages of the pixel-based optimization over the contour-based are demonstrated. The selective and the uniform weighting schemes for the image fidelity are proposed. The iterative source/mask optimization is proposed, which alternates OPC and source optimization steps. Finally, the source can be smoothed by optimizing to print certain important shapes.

While the preferred embodiment of the invention has been illustrated and described, it will be appreciated that various changes can be made therein without departing from the scope of the invention. It is therefore intended that the scope of the invention be determined from the following claims and equivalents thereof.

The embodiments of the invention in which an exclusive property of privilege is claimed are defined as follows:

1. A computer-readable storage medium storing a sequence of instructions that when executed by a computer causes the computer to perform a method, the method comprising:
    selecting a pattern of features in a layout database to be created on a wafer, wherein the selecting comprises determining that the pattern of layout features in the layout database occurs in an array;
    defining a mathematical relationship between one or more pixel intensities produced by a diffractive optical element and the selected pattern of features; and
    assigning pixel intensities for the diffractive optical element using the mathematical relationship, the pixel intensities being calculated to produce an image of the selected pattern of features on the wafer with greater image fidelity than other features in the layout database.

2. The computer-readable storage medium of claim 1, wherein one or more constraints are placed on the mathematical relationship.

3. The computer-readable storage medium of claim 2, wherein the one or more constraints include limiting the optical power of the assigned pixel intensities.

4. The computer-readable storage medium of claim 2, wherein the one or more constraints include limiting the assigned pixel intensities such that each pixel having a non-zero intensity is adjacent to at least one other pixel having a non-zero intensity.

5. The computer-readable storage medium of claim 2, wherein the one or more constraints include limiting the assigned pixel intensities such that the intensities of adjacent pixels do not vary by more than a predefined amount.

6. The computer-readable storage medium of claim 1, wherein the mathematical relationship is a matrix equation.

7. A method, comprising:
    by a computer,
    selecting a pattern of features in a layout database to be created on a wafer by determining one or more periodic patterns of features that occurs in the layout database;
    defining a mathematical relationship between one or more pixel intensities produced by a diffractive optical element and the selected pattern of features, the mathematical relationship including a heavier uniform edge weighting of edges of the periodic patterns of features or gate weighting for one or more gate regions of the periodic patterns of features selected to control fidelity more accurately than other regions of the periodic patterns of features; and
    assigning pixel intensities for the diffractive optical element using the mathematical relationship, the pixel intensities being calculated to produce an image of the desired pattern of features on the wafer, wherein the pixel intensities are further calculated to print the periodic features with greater image fidelity than other features in the layout database in proportion to the heavier weighting.

8. The method of claim 7, wherein one or more mathematical constraints are placed on the mathematical relationship to limit the assigned pixel intensities such that the intensities of adjacent pixels do not vary by more than a predefined amount.

9. The method of claim 7, wherein the mathematical relationship is a matrix equation.

10. The method of claim 7, wherein the periodic patterns of features are contacts in the layout database.

11. The method of claim 7, wherein the heavier weighting includes uniform edge weighting for the periodic features.

12. The method of claim 7, wherein the heavier weighting includes weighting gates in the periodic features to print with greater image fidelity.

13. The method of claim 7, further comprising manufacturing an integrated circuit using the assigned pixel intensities.

* * * * *